United States Patent [19]

Peczalski

[11] Patent Number: 4,760,288
[45] Date of Patent: Jul. 26, 1988

[54] TEMPERATURE COMPENSATION FOR SEMICONDUCTOR LOGIC GATES

[75] Inventor: Andrzej Peczalski, Brooklyn Park, Minn.

[73] Assignee: Honeywell Inc., Minneapolis, Minn.

[21] Appl. No.: 887,774

[22] Filed: Jul. 21, 1986

[51] Int. Cl.$^4$ .................. H03K 19/094; H03K 3/353; H03K 3/26; H03K 17/16
[52] U.S. Cl. .................. 307/448; 307/450; 307/443; 307/310; 307/304
[58] Field of Search ............... 307/310, 450, 475, 443, 307/491, 264, 317 A, 448, 304

[56] References Cited

U.S. PATENT DOCUMENTS

| | | | |
|---|---|---|---|
| 4,008,406 | 2/1977 | Kawagoe | 307/310 |
| 4,300,064 | 11/1981 | Eden | 307/450 |
| 4,558,235 | 12/1985 | White et al. | 307/450 |
| 4,622,476 | 11/1986 | Venkatesh | 307/310 |
| 4,661,726 | 4/1987 | Biard | 307/310 |

OTHER PUBLICATIONS

L. W. Atwood, "FET Circuits", vol. 6, No. 9, Feb. 1984.
G. U. Vack, "Simple Temperature-Stable Reference Source", Radio Fernsehen Elektronik, vol. 29, No. 3, 1980.
News Scope, "Schottky-diode FET/Logic Bring VLSI into the Real World", Electronic Design 5, Mar. 1978.
Van Tuyl, "GaAs MESFET Logic with 4-GHz Clock Rate", IEEE Journal of Solid State Circuits, vol. SC12, No. 5, Oct. 1977.

Primary Examiner—Stanley D. Miller
Assistant Examiner—Trong Quang Phan
Attorney, Agent, or Firm—George A. Leone, Sr.; John G. Shudy, Jr.

[57] ABSTRACT

A temperature compensation system for semiconductor digital or analog circuits where the temperature compensation is accomplished by two depletion mode MESFETs. A first MESFET is adapted to operate as a level shifter in the linear region of operation only in combination with a second MESFET adapted to operate in the saturation region of operation.

19 Claims, 1 Drawing Sheet

TEMPERATURE COMPENSATION FOR SEMICONDUCTOR LOGIC GATES The present invention relates to semiconductor logic gates comprising depletion mode and enhancement mode metal semiconductor field effect transistors (MESFETs) and more particularly to temperature compensation therefor.

BACKGROUND OF THE INVENTION

Some types of semiconductor logic gates show a strong temperature dependence. This effect has proved to be particularly a problem in logic gates which use gallium arsenide (GaAs) depletion mode MESFETs but also may arise in other instances. The result of this temperature dependence is to limit the temperature range over which such logic gates may be used. This limited temperature range is much less than the full military temperature range of −55° C. to +125° C. for some logic families. In order to obtain logic gates of such families which can operate over this entire range, temperature compensation is required. The present invention provides a temperature compensation system.

In typical GaAs circuits such as Schottky Diode FET Logic (SDFL), Buffered FET Logic (BFL), Source Coupled FET Logic (SCFL), and input and output buffers, logic level shifting is achieved by Schottky diodes connected in series with a current source. FIG. 1 shows a typical level shifting circuit employing a Schottky diode 10 in series with an FET 20. Circuits of the type shown in FIG. 1 are of limited utility over wide temperature ranges because the negative temperature coefficient of the Schottky diode voltage drop adds to the negative temperature coefficient of the FET threshold voltage, $V_T$. Schottky diodes and MESFETs typically have temperature coefficients on the order of −1.1 mV/°C. and −1.3 mV/°C., respectively. Consequently, the noise margin of the circuit deteriorates rapidly with temperature variations. SDFL gate arrays implemented with standard Schottky diode level shifters can be expected to work only over a temperature range of about −35° C. to about +73° C.

SUMMARY OF THE INVENTION

A temperature compensated logic gate comprising depletion mode MESFETs is disclosed. Said logic gate is constructed at least in part in a body of semiconductor materials, said logic gate having temperature compensation means. Said temperature compensation means comprises a first and second depletion mode MESFET means. The first depletion mode MESFET means has first and second terminating regions in said semiconductor body and a gate terminating region comprising a metallic electrical conductor means on a surface of said semiconductor body. Said first MESFET means' first terminating region is adapted to operate at a higher voltage than said first MESFET means' second terminating region. Said MESFET means' gate terminating region is electrically connected to said first MESFET means' first terminating region, said first MESFET means being adapted to operate at current levels within its linear region of operation. The second MESFET means has first and second terminating regions in said semiconductor body and a gate terminating region said second MESFET means' first terminating region being adapted to operate at a higher voltage than said second MESFET means' second terminating region, said second MESFET means' gate terminating region being electrically connected to said second MESFET means' second terminating region, said second MESFET means' first terminating region being electrically connected to said first MESFET means' second terminating region, said second MESFET means being adapted to operate at current levels in its saturation mode of operation.

DETAILED DESCRIPTION OF THE PREFERRED EMBODIMENT

The temperature compensation scheme of the invention has been tested with logic gates which utilize gallium arsenide (GaAs) metal semiconductor field effect transistors (MESFETs). The invention will therefore be described in terms of such logic gates. In the discussion to follow, the parameters and dimensions given are for one example of an embodiment of the invention based on actual data derived from a device built by Honeywell Inc. of Minneapolis, Minn. Those skilled in the art will perceive that other dimensions could be used and might be required by variations from the devices described herein or by differences in products produced by different processes.

Figure 1:
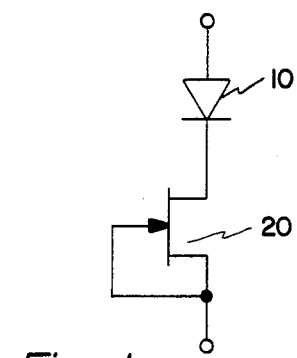
FIG. 1 is a schematic diagram of a standard level shifting circuit.
Figure 2:
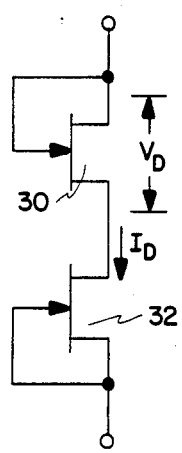
FIG. 2 is a schematic diagram of the temperature compensation element of the present invention.

FIG. 2 shows the basic temperature compensating element of the invention. This element comprises two depletion mode GaAs MESFETs 30 and 32. MESFET 30 operates in the linear region and MESFET 32 operates in the saturation region. The gate of MESFET 30 is connected to its drain. The gate of MESFET 32 is connected to its source. MESFET 30 is thus approximately equivalent to a resistor with a positive temperature coefficient. Thus, the temperature shift of the operating point of the circuit is compensated over wide temperature ranges. The source of MESFET 30 is connected to the drain of MESFET 32. MESFET 30 may be referred to as the level shifting transistor, while MESFET 32 may be referred to as the pull-down transistor.

Figure 3:
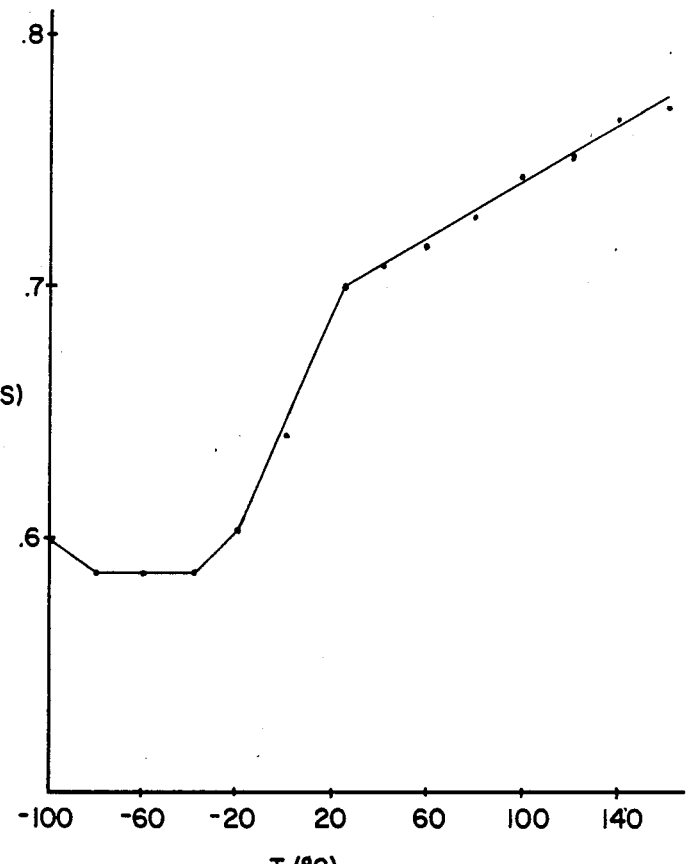
FIG. 3 is a plot of experimental data showing the temperature dependence of the present invention.

FIG. 3 is a plot of the voltage drop $V_D$ across the level shifting transistor 30 versus temperature in degrees Centigrade, T(°C.) for one device of the invention. In the embodiment of the invention used for the device, the gate of the level shifting transistor had a length of 1 micrometer and a width of 10 micrometers. The gate of the pull-down transistor had a length of 1 micrometer and a width of 20 micrometers. It will be apparent to those skilled in the art that the dimensions chosen for the model are only one example of possible dimensions that may be advantageously employed in the invention and that other dimensions may be employed without destroying the utility of the invention.

Those skilled in the art will recognize from the plot of FIG. 3 that the invention operates over the entire military temperature range of about −55° C. to about +125° C. In particular, in the range of about +24° C. to about +140° C. the voltage drop, $V_D$, on the level shifting transistor may be expressed by the following quadratic equation:

$$VD = |V_T| \left[ \sqrt{1 + \frac{I_d}{I_{dss}}} - 1 \right]$$

In the above equation $V_T$ is the threshold voltage, $I_d$ is the current of the pull-down transistor in saturation at $V_{GS}=0$ and $I_{dss}$ is the current of the level shifting transistor in saturation at $V_{GS}=0$. $V_{GS}$ is the gate to source voltage of the MESFET.

For the model plotted in FIG. 3 the voltage drop $V_D$ over the temperature range of about $+24°$ C. to about $+140°$ C. had a positive temperature coefficient of about $+0.57$ mv/°C. A typical temperature coefficient for $V_T$ for a depletion mode MESFET is about $-1.3$ mv/°C. In some cases the temperature coefficient for $V_T$ may be as large as $-2$ mv/°C. Those skilled in the art will appreciate that the temperature compensation circuit of the invention may be stacked up to compensate for the larger negative temperature coefficients of $V_T$.

Experimental data have also shown that, when compared to standard level shifting devices, the device of the invention exhibits a large voltage drop, $V_D$, which is approximately 70% of $V_T$ for typical MESFET devices. The device of the invention also exhibits a large current capability during transient switching and is small in size since the level shifting transistor's saturation current must be about two times smaller than the pull-down transistor's current in saturation.

Figure 4:
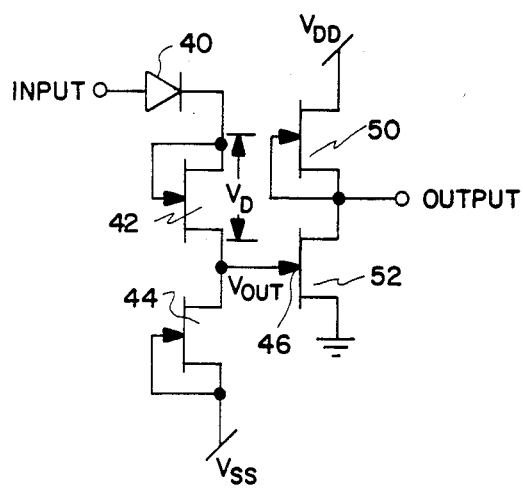
FIG. 4 is a schematic diagram of a Schottky diode FET logic gate with temperature compensation.

Referring now to FIG. 4, an SDFL gate employing one embodiment of the temperature compensation scheme of the invention is shown. The gate comprises MESFETs 42, 44, 50, and 52 and diode 40. MESFETs 42 and 44 are connected together in accordance with the scheme of the invention as shown at FIG. 2. Diode 40 is connected at the annode to an input whereon an electrical signal is applied. The cathode of diode 40 is connected to the drain of MESFET 42. The source of MESFET 42 and the drain of MESFET 44 are connected at node 46 to the gate of MESFET 52. MESFET 52 is connected from source to ground and from drain to the source of MESFET 50 and to the output of the gate. The source of MESFET 50 is connected to an external voltage source, $V_{DD}$. The source of MESFET 44 is connected to a second external voltage source designated $V_{SS}$.

As used in the gate configuration shown in FIG. 4, the invention works as follows. The invention takes advantage of the fact that in MESFETs the threshold voltage, $V_T$, decreases as temperature increases. Therefore, in order for the gate to work over large temperature ranges, the output voltage of the level shifter circuit, $V_{out}$, must also decrease as temperature increases. In other words, as $V_T$ falls, $V_{out}$ must also fall in order to be able to maintain control over the output of the gate. The device of the invention has a positive temperature coefficient for $V_D$, which is the voltage drop across the level shifting transistor. Therefore, as $V_D$ increases with increasing temperature, $V_{out}$ must decrease thereby making the device operable over a large temperature range. In prior art devices having negative temperature coefficients for $V_D$, as temperature goes up, $V_D$ decreases resulting in $V_{out}$ increasing as $V_T$ decreases. This results in an inability to turn MESFET 52 off and to control the gate because at higher temperatures $V_T$ will always be exceeded by $V_{out}$ when using depletion mode MESFETs.

Figure 5:
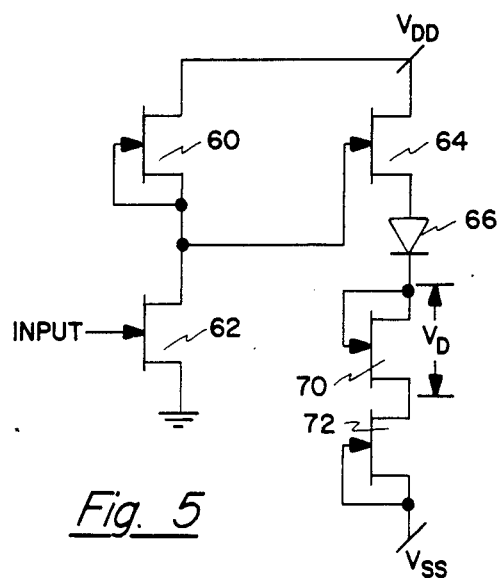
FIG. 5 is a schematic diagram of a buffered FET logic gate with temperature compensation.

FIG. 5 shows the temperature compensating scheme of the invention incorporated into a BFL gate. The gate comprises MESFETs 60, 62, 64, 70, and 72 and diode 66 connected in a pattern suitable to form a BFL gate. MESFETs 70 and 72 are connected according to the scheme of the invention as explained above.

The present discussion has shown the use of the basic temperature compensating element of FIG. 2 with SDFL and BFL circuits. Those skilled in the art will perceive that this system for temperature compensation is not limited to such circuits. Other types of logic families could be used with similar temperature compensation. Among those which could be effectively used with the present temperature compensation system are source coupled FET logic (SCFL) and low pinch-off FET logic (LPFL). These and other various modifications of the present invention can be made without departing from the spirit or scope of the present invention.

The embodiments in which an exclusive property or privilege is claimed are defined as follows:

1. A temperature compensated electrical circuit comprising depletion mode MESFETS, said circuit being constructed at least in part in a body of semiconductor materials, said circuit having temperature compensation means, said temperature compensation means comprising:

a first depletion mode MESFET means having first and second terminal regions in said semiconductor body and a gate terminal region comprising a metallic electrical conductor means on a surface of said semiconductor body, wherein said first depletion mode MESFET means' first terminal region is operated at a higher voltage than said first depletion mode MESFET means' second terminal region, said first depletion mode MESFET means' gate terminal region is electrically connected to said first depletion mode MESFET means' first terminal region, and said first depletion mode MESFET means is operated at current levels within its linear region of operation; and second depletion mode MESFET means having first and second terminal regions in said semiconductor body and a gate terminal region, wherein said second depletion mode MESFET means' first terminal region is operated at a higher voltage than said second depletion mode MESFET means' second terminal region, said second depletion mode MESFET means' gate terminal region is electrically connected to said second MESFET means' second terminal region, said second depletion mode MESFET means' first terminal region is electrically connected to said first depletion mode MESFET means' second terminal region, and said second depletion mode MESFET means is operated at current levels in its saturation mode of operation.

2. The apparatus of claim 1 wherein said semiconductor body comprises gallium arsenide.

3. The apparatus of claim 1 wherein said circuit comprises a logic gate of the type known as Schottky diode FET logic.

4. The apparatus of claim 3 wherein said semiconductor body comprises gallium arsenide.

5. The apparatus of claim 1 wherein said circuit comprises a logic gate of the type known as buffered FET logic.

6. The apparatus of claim 5 wherein said semiconductor body comprises gallium arsenide.

7. The apparatus of claim 1 wherein the voltage drop across said first depletion mode MESFET means is expressed by the quadratic equation:

$$VD = V_T\left[\sqrt{1 + \frac{I_d}{I_{dss}}} - 1\right]$$

where $V_D$ is the voltage drop, $V_T$ is the threshold voltage of said first depletion mode MESFET, $I_d$ is the current of second depletion mode MESFET in saturation and $I_{dss}$ is the current of said first depletion mode MESFET in saturation at $V_{GS}=0$ and where temperature is in the range of about +24° C. to about +140° C.

8. The apparatus of claim 7 wherein said semiconductor body comprises gallium arsenide.

9. A temperature compensation arrangement comprising first and second depletion mode MESFET means, wherein said first and second depletion mode MESFET means is operated at current levels within their linear region of operation, said first depletion mode MESFET means further having its drain electrically connected to its gate and its source electrically connected to the drain of said second depletion mode MESFET means, said second depletion mode MESFET having its gate electrically connected to its source.

10. The apparatus of claim 9 wherein said semiconductor body comprises gallium arsenide.

11. The apparatus of claim 10 adapted to a logic gate of the type known as Schottky diode FET logic.

12. The apparatus of claim 11 wherein said semiconductor body comprises gallium arsenide.

13. The apparatus of claim 9 wherein said apparatus is adapted to a logic gate of the type known as buffered FET logic.

14. The apparatus of claim 13 wherein said semiconductor body comprises gallium arsenide.

15. The apparatus of claim 9 wherein the voltage drop across said first depletion mode MESFET means is expressed by the quadratic equation:

$$VD = V_T\left[\sqrt{1 + \frac{I_d}{I_{dss}}} - 1\right]$$

where $V_D$ is the voltage drop, $V_T$ is the threshold voltage of said first depletion mode MESFET, $I_d$ is the current of said second depletion mode MESFET in saturation and $I_{dss}$ is the current of said first depletion mode MESFET in saturation at $V_{GS}=0$ and where temperature is in the range of about +24° C. to about +140° C.

16. The apparatus of claim 15 wherein said semiconductor body comprises gallium arsenide.

17. A temperature compensation circuit comprising first and second depletion mode MESFET means which operate at current levels within their linear and saturation region of operation respectively, said first depletion mode MESFET means having a gate, said first depletion mode MESFET means gate having a width of about 10 micrometers and a length of about 1 micrometer, said first depletion mode MESFET means gate being electrically connected to the drain of said first depletion mode MESFET means; said second depletion mode MESFET means having a gate, said second depletion mode MESFET means gate being electrically connected to the drain of said second depletion mode MESFET means; and the source of both first and second depletion mode MESFET means being electrically connected.

18. The apparatus of claim 17 wherein the voltage drop across said first depletion mode MESFET means is expressed by the quadratic equation:

$$VD = V_T\left[\sqrt{1 + \frac{I_d}{I_{dss}}} - 1\right]$$

where $V_D$ is the voltage drop, $V_T$ is the threshold voltage of said first depletion mode MESFET, $I_d$ is the current of said second depletion mode MESFET in saturation at $V_{GS}=0$, and $I_{dss}$ is the current of said first depletion mode MESFET in saturation at $V_{GS}=0$ and where temperature is in the range of about +24° C. to about +140° C.

19. The apparatus of claim 18 wherein said semiconductor body comprises gallium arsenide.

* * * * *